United States Patent
McCollum

(10) Patent No.: US 10,607,696 B2
(45) Date of Patent: Mar. 31, 2020

(54) FPGA CONFIGURATION CELL UTILIZING NVM TECHNOLOGY AND REDUNDANCY

(71) Applicant: Microsemi SoC Corp., San Jose, CA (US)

(72) Inventor: John L. McCollum, Orem, UT (US)

(73) Assignee: Microsemi SoC Corp., San Jose, CA (US)

(*) Notice: Subject to any disclaimer, the term of this patent is extended or adjusted under 35 U.S.C. 154(b) by 0 days.

(21) Appl. No.: 16/239,391

(22) Filed: Jan. 3, 2019

(65) Prior Publication Data

US 2019/0221259 A1    Jul. 18, 2019

Related U.S. Application Data

(60) Provisional application No. 62/617,848, filed on Jan. 16, 2018.

(51) Int. Cl.
| | |
|---|---|
| G11C 13/00 | (2006.01) |
| H01L 27/24 | (2006.01) |
| H03K 19/094 | (2006.01) |
| H03K 19/1776 | (2020.01) |
| H01L 45/00 | (2006.01) |

(52) U.S. Cl.
CPC ...... *G11C 13/0026* (2013.01); *G11C 13/0028* (2013.01); *H01L 27/2436* (2013.01); *H01L 45/12* (2013.01); *H03K 19/0941* (2013.01); *H03K 19/1776* (2013.01)

(58) Field of Classification Search
CPC . G11C 13/0026; G11C 13/0028; H03K 45/12
USPC .......................... 365/148, 163, 171, 173, 158
See application file for complete search history.

(56) References Cited

U.S. PATENT DOCUMENTS

| | | | | |
|---|---|---|---|---|
| 2013/0258766 A1* | 10/2013 | Conte | ...................... | G11C 8/10 365/163 |
| 2017/0352394 A1* | 12/2017 | Gupta | .................... | G11C 7/062 |

* cited by examiner

*Primary Examiner* — Han Yang
(74) *Attorney, Agent, or Firm* — Glass and Associates; Kenneth Glass; Kenneth D'Alessandro

(57) ABSTRACT

A nonvolatile memory cell includes a first voltage supply node, a second voltage supply node, an output node, a resistive random access memory device having a first electrode and a second electrode, the first electrode connected to the first voltage supply node, at least one p-channel transistor connected between the second electrode of the resistive random access memory device and the output node, at least one n-channel transistor connected between the output node and the second voltage supply node, and an inverter connected between the output node and a gate of the at least one n-channel transistor.

18 Claims, 6 Drawing Sheets

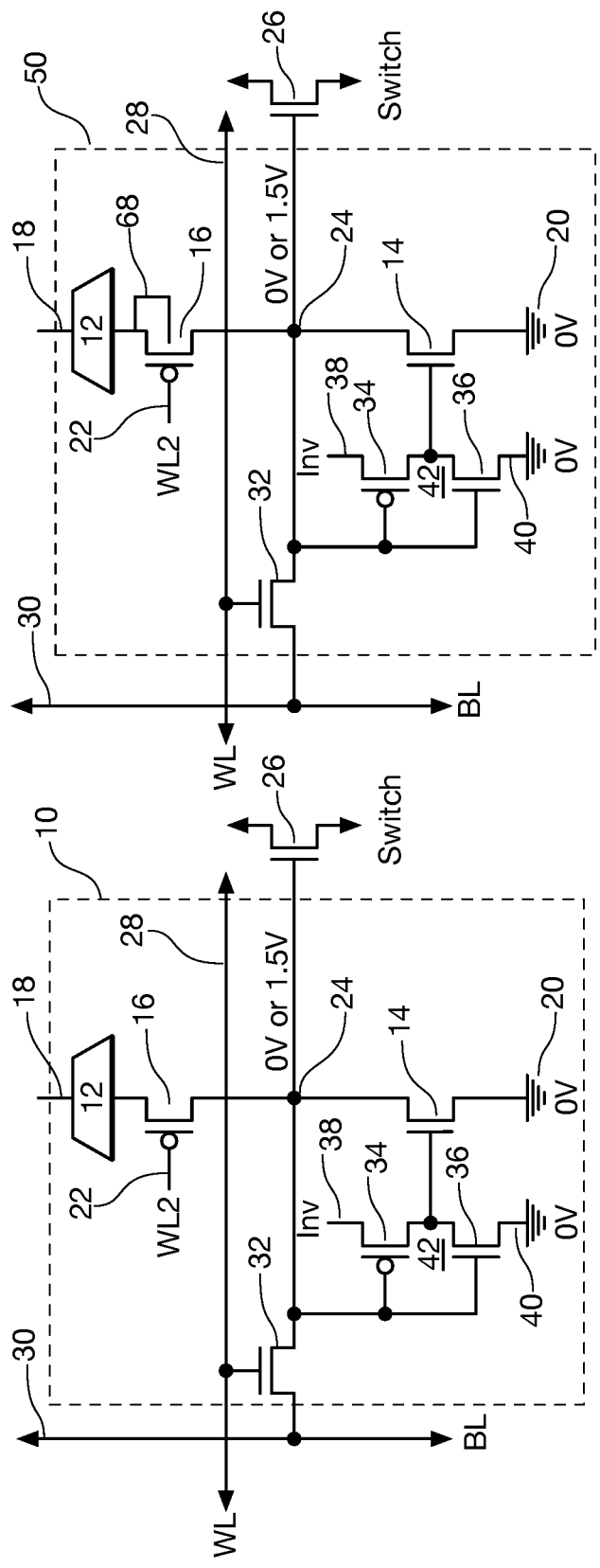
FIG. 1
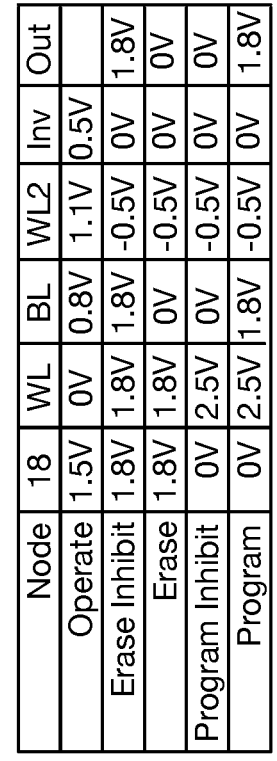
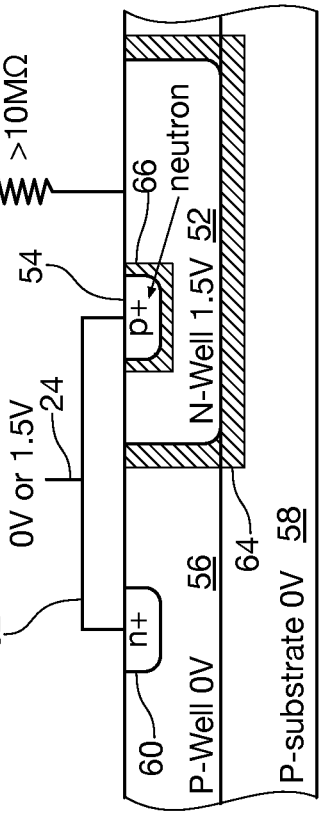
FIG. 2A
FIG. 2B
FIG. 2C

| Node | 18 | WL | BL | WL2 | Inv | 24 |
|---|---|---|---|---|---|---|
| Operate | 1.5V | 0V | 0.8V | 1.1V | 0.5V | |
| Erase Inhibit | 1.8V | 1.8V | 1.8V | -0.5V | 0V | 1.8V |
| Erase | 1.8V | 1.8V | 0V | -0.5V | 0V | 0V |
| Program Inhibit | 0V | 2.5V | 0V | -0.5V | 0V | 0V |
| Program | 0V | 2.5V | 1.8V | -0.5V | 0V | 1.8V |

| Node | 18 | WL | BL | WL2 | Inv | Out |
|---:|---|---|---|---|---|---|
| Operate | 1.5V | 0V | 0.8V | 1.1V | 0.5V | |
| Erase Inhibit | 1.8V | 1.8V | 1.8V | -0.5V | 0V | 1.8V |
| Erase | 1.8V | 1.8V | 0V | -0.5V | 0V | 0V |
| Program Inhibit | 0V | 2.5V | 0V | -0.5V | 0V | 0V |
| Program | 0V | 2.5V | 1.8V | -0.5V | 0V | 1.8V |

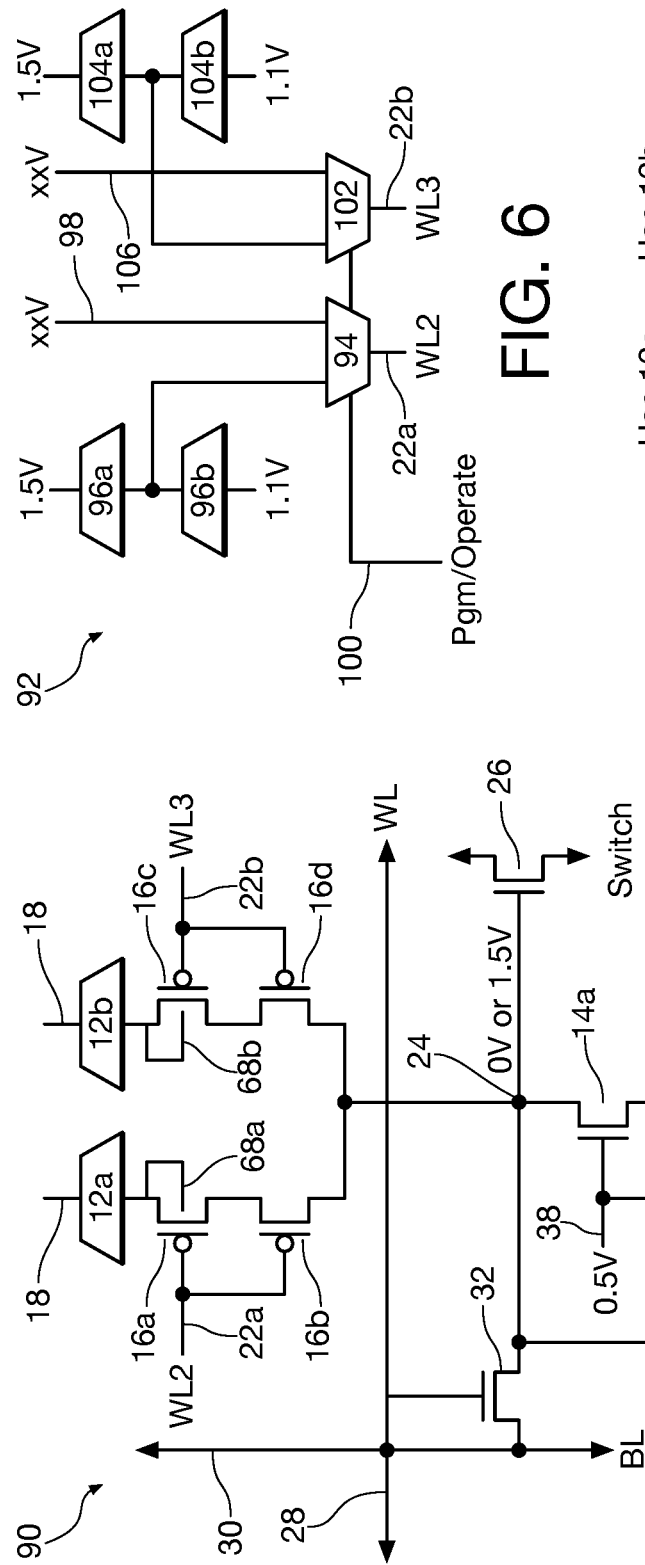
FIG. 5A
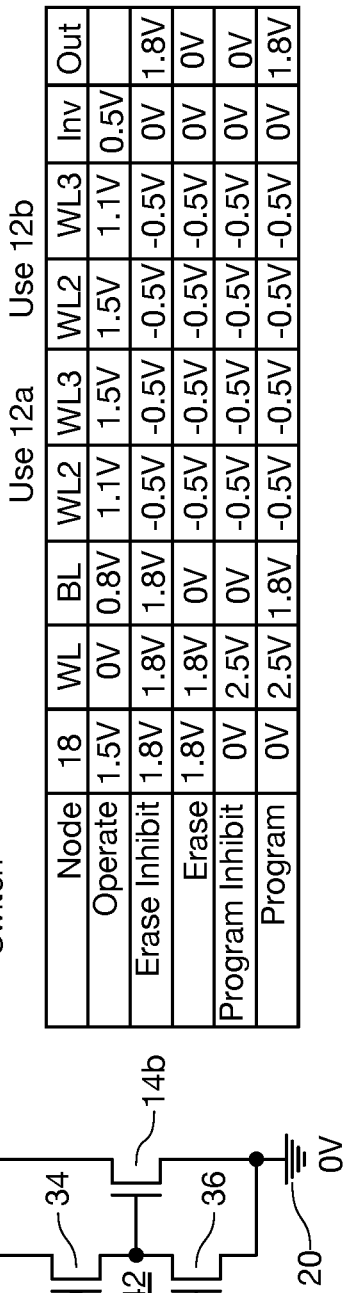
FIG. 5B
FIG. 6

| Node | VBE | VBO | WL | BL | WL1A | WL1B | Out | Inv |
|---|---|---|---|---|---|---|---|---|
| Operate | 1.5V | 0.8V | 0V | 0.8V | 1.1V | 1.5V | 0.5V | |
| Erase Inhibit | 1.8V | 0.8V | 1.8V | 0V | 0V | 1.8V | 1.8V | 1.8V |
| Erase | 0V | 0.8V | 1.8V | 1.8V | 0V | 1.8V | 0V | 0V |
| Program Inhibit | 0V | 0.8V | 2.5V | 1.8V | -0.8V | 1.8V | 0V | 0V |
| Program | 1.8V | 0.8V | 2.5V | 0V | -0.8V | 1.8V | 1.8V | 1.8V |

FIG. 7B

| Node | VBE | VBO | WL | BL | WL1A | WL1B | Inv | Out |
|---|---|---|---|---|---|---|---|---|
| Operate | 0.8V | 1.5V | 0V | 0.8V | 1.5V | 1.1V | 0.5V | |
| Erase Inhibit | 0.8V | 1.8V | 1.8V | 0V | 1.8V | 0V | 1.8V | 1.8V |
| Erase | 0.8V | 0V | 1.8V | 1.8V | 1.8V | 0V | 0V | 0V |
| Program Inhibit | 0.8V | 0V | 2.5V | 1.8V | 1.8V | -0.8V | 0V | 0V |
| Program | 0.8V | 1.8V | 2.5V | 0V | 1.8V | -0.8V | 1.8V | 1.8V |

FIG. 7C

FPGA CONFIGURATION CELL UTILIZING NVM TECHNOLOGY AND REDUNDANCY

BACKGROUND

The present invention relates to integrated circuit technology. More particularly, the present invention relates to user-programmable integrated circuits and to a configuration memory cell for programming such integrated circuits.

Numerous technologies are available for configuration memory cells for programming user-programmable integrated circuits. Both dynamic (SRAM type) and static (NVM type) memory cells are known.

In particular, resistive random-access memory (ReRAM) devices have been proposed for use in configuration memories for user-programmable integrated circuits such as field programmable gate array (FPGA) integrated circuits. One example is found in US Patent Application Publication S/N 2017/0179959 published Jun. 22, 2017 to the present applicant. ReRAM devices employ a solid electrolyte material disposed between two conductive electrodes. One of the conductive electrodes serves as a metal ion source. Initially, only a high-impedance path (on the order of >1 GΩ) exists between the two conductive electrodes. The ReRAM device is programmed by applying a sufficient potential of a first polarity across the ReRAM device, causing metal ions from the ion source conductive electrode to migrate into the solid electrolyte layer and form a conductive path between the two conductive electrodes. The ReRAM device is erased to return it to its high-impedance state by applying a sufficient potential of a second polarity, opposite the first polarity, across the ReRAM device, causing metal ions in the conductive path to migrate back to the ion source and remove the conductive path between the two conductive electrodes.

Unfortunately, ReRAM devices may be faulty, or become stuck in one of the two states, or even enter into an intermediate state. The arrangement of the prior art requires an option to provide redundancy of the entire cell in order to ensure proper operation in face of this possibility.

BRIEF DESCRIPTION

According to one aspect of the present invention, a nonvolatile memory cell includes a first voltage supply node, a second voltage supply node, an output node, a resistive random access memory device having a first electrode and a second electrode, the first electrode connected to the first voltage supply node, at least one p-channel transistor connected between the second electrode of the resistive random access memory device and the output node, at least one n-channel transistor connected between the output node and the second voltage supply node, and an inverter connected between the output node and a gate of the at least one n-channel transistor.

According to another aspect of the present invention, a nonvolatile memory cell includes first and second voltage supply nodes, and an output node. A ReRAM memory device has a first electrode connected to the first voltage supply node. A p-channel transistor is connected between the second electrode of the ReRAM device and the output node. The source of the p-channel transistor is connected to an n-well in which the p-channel transistor is disposed. An n-channel transistor is connected between the output node and the second voltage supply node. An inverter includes a p-channel inverter transistor in series with an n-channel inverter transistor. The source of the p-channel inverter transistor is coupled to a first inverter voltage potential and the source of the n-channel inverter transistor coupled to a second inverter voltage potential. The gates of the inverter p-channel transistor and the n-channel inverter transistor are connected together to the output node. The common drains of the p-channel inverter transistor and the n-channel inverter transistor are coupled to the n-channel transistor.

According to another aspect of the present invention, a nonvolatile memory cell includes first and second voltage supply nodes, and an output node. A ReRAM memory device has a first electrode connected to the first voltage supply node. A pair of p-channel transistors are connected in series between the second electrode of the ReRAM device and the output node. A pair of n-channel transistors are connected in series between the output node and the second voltage supply node. An inverter includes a p-channel inverter transistor in series with an n-channel inverter transistor. The source of the p-channel inverter transistor is coupled to a first inverter voltage potential and to the gate of a first one of the n-channel transistors. The source of the n-channel inverter transistor is coupled to a second inverter voltage potential. The gates of the inverter p-channel transistor and the n-channel inverter transistor are connected together to the output node. The common drains of the p-channel inverter transistor and the n-channel inverter transistor are coupled to a second one of the n-channel transistors.

According to another aspect of the present invention, redundant ReRAM memory cells are provided having multiple ReRAM memory devices that are individually selectable within the memory cell.

BRIEF DESCRIPTION OF THE DRAWING FIGURES

The invention will be explained in more detail in the following with reference to embodiments and to the drawing in which are shown:

FIG. 1 is a schematic diagram of an illustrative configuration memory cell in accordance with one aspect of the present invention;

FIG. 2A is a schematic diagram of an illustrative radiation-tolerant configuration memory cell in accordance with one aspect of the present invention;

FIG. 2B is a semiconductor cross section of a portion of the radiation-tolerant configuration memory cell of FIG. 2A showing its radiation tolerance features;

FIG. 2C is a table showing the potentials applied to the various nodes of the configuration memory cells of FIGS. 1 and 2A during different operating modes;

FIG. 5A is a schematic diagram of an illustrative redundant configuration memory cell in accordance with one aspect of the present invention;

FIG. 5B is a table showing the potentials applied to the various nodes of the configuration memory cell of FIG. 5A during different operating modes;

FIG. 6 is a schematic diagram of illustrative selection circuitry that may be used with the redundant configuration memory cell of FIG. 5A;

FIG. 7B is a table showing the potentials applied to the various nodes of the redundant configuration memory cell of FIG. 7A during different operating modes when the left ReRAM device is active.

FIG. 7C is a table showing the potentials applied to the various nodes of the redundant configuration memory cell of FIG. 7A during different operating modes when the right ReRAM device is active.

DETAILED DESCRIPTION

Figures 3A, 3B:
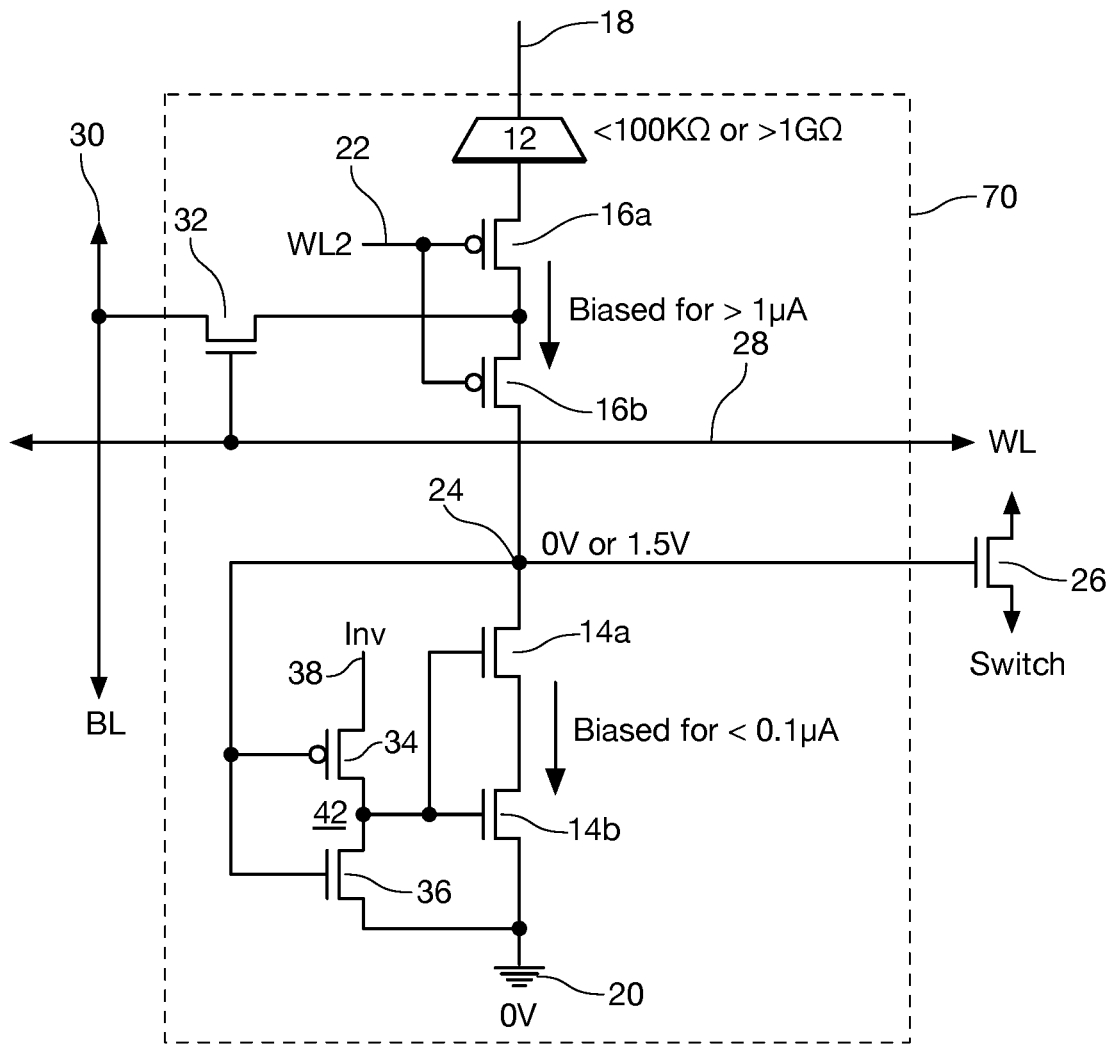
FIG. 3A is a schematic diagram of an illustrative configuration memory cell in accordance with an aspect of the present invention.
FIG. 3B is a table showing the potentials applied to the various nodes of the configuration memory cell of FIG. 3A during different operating modes.

Persons of ordinary skill in the art will realize that the following description of the present invention is illustrative only and not in any way limiting. Other embodiments of the invention will readily suggest themselves to such skilled persons.

Referring first of all to FIG. 1, a schematic diagram shows an illustrative configuration memory cell 10 in accordance with one aspect of the present invention. Configuration memory cell 10 is a push-pull memory cell and employs a ReRAM device 12 as a pullup device and n-channel transistor 14 as a pulldown device. The symbol for the ReRAM device 12 is depicted having a thicker line width at its wider parallel side. This thicker line width represents the end of the ReRAM device connected to the metal layer that functions as the ion source for the ReRAM device. ReRAM device 12 is connected in series with a p-channel transistor 16 and n-channel transistor 14 between a first voltage potential 18 and a second voltage potential 20. The gate of the p-channel transistor 16 is connected to a global word line (WL2) 22. The common drain connections of the p-channel transistor 16 and the n-channel transistor 14 forms an output node 24 for the configuration memory cell 10. The output node 24 drives the gate of a switch transistor 26 controlled by the configuration memory cell 10.

Each configuration memory cell 10 is located at an intersection between a word line (WL) 28 and a bit line (BL) 30. An n-channel select transistor 32 is connected between the bit line BL 30 and the output node 24 of the memory cell 10. The gate of the n-channel select transistor 32 is connected to the word line WL 28. As will be appreciated by persons of ordinary skill in the art, WL 28 is usually associated with the row of the array containing the memory cell 10 and the bit line 30 is usually associated with the column of the array containing the memory cell 10, although memory arrays can be configured with word lines associated with columns and bit lines associated with rows.

An inverter 42 shown in this non-limiting embodiment as being formed from p-channel inverter transistor 34 and n-channel inverter transistor 36 is connected between the output node 24 of the memory cell 10 and the gate of the n-channel transistor 14. The source of the p-channel inverter transistor 34 is connected to a node INV 38 and the source of the n-channel inverter transistor 36 is connected to a voltage node 40. Voltage node 40 is typically connected to ground. Configuration memory cell 10 advantageously requires only a single ReRAM device 12 for operation, as compared to the dual ReRAM device configuration of the prior art cited above.

A variation of the configuration memory cell 10 of FIG. 1 is a radiation-tolerant configuration memory cell 50 shown in FIG. 2A. Many of the elements of configuration memory cell 10 are present in the radiation-tolerant configuration memory cell 50 of FIG. 2A and the same reference numerals used in FIG. 1 will be used in FIG. 2A to identify like elements in FIG. 2A.

Radiation-tolerant configuration memory cell 50 is also a push-pull memory cell and employs a ReRAM device 12 as a pullup device and n-channel transistor 14 as a pulldown device. ReRAM device 12 is connected in series with a p-channel transistor 16 and n-channel transistor 14 between a first voltage potential 18 and a second voltage potential 20 (shown as ground). The gate of the p-channel transistor 16 is connected to a global word line (WL2) 22. The common drain connections of the p-channel transistor 16 and the n-channel transistor 14 forms an output node 24 for the radiation-tolerant configuration memory cell 50. The output node 24 drives the gate of a switch transistor 26 controlled by the radiation-tolerant configuration memory cell 50.

Each radiation-tolerant configuration memory cell 50 is located at an intersection between a word line (WL) 28 and a bit line (BL) 30. An n-channel select transistor 32 is connected between the bit line BL 30 and the output node 24 of the radiation-tolerant configuration memory cell 50. The gate of the n-channel select transistor 32 is connected to the word line WL 28.

An inverter 42 formed from p-channel inverter transistor 34 and n-channel inverter transistor 36 is connected between the output node 24 of the radiation-tolerant configuration memory cell 50 and the gate of the n-channel transistor 14. The source of the p-channel inverter transistor 34 is connected to a node INV 38 and the source of the n-channel inverter transistor 36 is connected to a voltage node 40. Voltage node 40 is typically connected to ground.

The p-channel transistor 16 in radiation-tolerant configuration memory cell 50 is formed in an n-well 52 (shown in FIG. 2B) and its drain is shown in FIG. 2B as diffused p+ region 54 in n-well 52. N-well 52, and p-well 56 in which the n-channel transistor 14 of FIG. 2A is formed are both formed in semiconductor substrate 58 as is known in the art. N+ region 60 in p-well 56 of FIG. 2B forms the drain of the n-channel transistor 14 of FIG. 2A. Wire segment 62 in FIG. 2B which forms output node 24 connects p+ region 54 (the drain of p-channel transistor 16 of FIG. 2A) to n+ region 60 (the drain of n-channel pulldown transistor 14 of FIG. 2A).

In most CMOS circuits, persons skilled in the art will appreciate that regions like n-well 52 would be biased at the most positive voltage applied to the p-channel transistor so as to assure that pn junction from n-well 52 to p+ region 54 and the pn junction from well 52 to p-type substrate 58 both remain reverse biased under all circuit operating conditions. This applies during all of the operate, program, and erase modes. This is usually done by connecting the positive power supply to the n-well 52. Doing so creates a space charge region indicated at reference numeral 64 between the n-well 52 and the p-type substrate 58. Another space charge region 66 exists around p+ region 54.

In the memory cell 10 of FIG. 1, using the normal connection to the positive power supply to bias the n-well 52 can have undesired consequences for the configuration memory cell 10. If a particle such as a neutron strikes the n-well 52, it creates a short-lived conductive path between the n-well 52 and the p+ region 54 as indicated by the arrow extending from n-well 52 to p+ region 54. When the configuration ReRAM cell 10 is in its low state, i.e. ReRAM device 12 is in the high impedance state and n-channel transistor 14 is turned on, the output node 24 is at 0V and a particle strike can create a low impedance path between the drain of p-channel transistor 16 (reference numeral 54 in FIG. 2B) and the n-well 52 in which it is disposed that can trip the output node 24 to a high (on) state. This can occur because the n-well 52 is at the highest positive voltage in the configuration memory and a momentary positive voltage spike on the output node 24 caused by a particle strike can trip the inverter 42 (transistors 34 and 36, whose input at the gates of transistors 34 and 36 are connected together to the output node 24) to a low output, turning off n-channel transistor 14. Leakage through the off-state ReRAM device 12 can be enough sustain the output node 24 in the high state because the n-channel transistor 14 is turned off and is unable to pull output node 24 back to ground. In contrast, when the configuration memory 10 is in its high state the output node 24 is pulled up to the supply voltage level and is stable, preventing any glitches that might occur from flipping the state of the memory cell 10.

To prevent this condition from occurring, the bias to the n-well 52 in radiation-tolerant configuration memory cell 50 is supplied through the ReRAM device 12 by a connection between the source of the p-channel transistor 16 and the n-well 52. This is a high impedance connection to node 18 through the off-state ReRAM device 12 which only passes leakage current and is symbolized by high-value resistor 68 in FIG. 2B. Because the positive voltage bias is supplied to the n-well 52 by a high impedance connection, a large amount of current will not flow in response to the momentary breakdown of the space charge region 66 caused by a particle strike, and not enough current will be passed during this brief time period to trip the output node 24 to a high (off) state.

FIG. 2C is a table that shows the bias potentials to be applied to the configuration memory cell 10 and radiation tolerant configuration cell 50 during all of its operating modes, including inhibiting and enabling erasing and programming the memory cells. During powerup of the integrated circuit including an array of the memory cells according to the present invention, groups of memory cells (e.g., a row, or a block) have their wordlines WL momentarily placed at a logic high potential and their bitlines (BL) momentarily placed at 0V to force the output nodes 24 of all of the cells to 0V. Once this procedure is completed, the output nodes 24 of memory cells that are in a programmed state will be pulled high through the low-impedance on-state ReRAM device to which they are coupled.

As is readily apparent to persons skilled in the art, the "Operate" mode is when the output of the memory cell is controlling a static circuit function, i.e. controlling switch 26 to be on, or off. Node 18 is at 1.5V, the voltage at word line WL 28 is at 0V, the voltage at bitline BL 30 is at an intermediate voltage such as 0.8V. Under these conditions n-channel select transistor 32 is turned off. The voltage at WL2 is at a voltage such as 1.1V to turn on the p-channel transistor 16 but limit the voltage drop across the ReRAM device 12 when ReRAM device 12 is in its off, i.e. high impedance, state. The node Inv 38 is at a potential such as 0.5V, turning on the inverter 42 formed from transistors 34 and 36 so as to set n-channel transistor 14 so as to maintain the state of output node 24.

The column entry "Out", which represents the voltage at output node 24, is left blank to indicate that the ReRAM device 12 can be in either its on (programmed) or off (erased) state. If ReRAM 12 has been programmed to its on state, output node 24 will be pulled up. This action pulls up the gates of inverter transistors 34 and 36, and as a result transistor 36 pulls down the gate of n-channel transistor 14, turning it off. This negative feedback holds output node 24 at 1.5V. If ReRAM 12 has been erased to its off state, output node 24 will be at 0V. This action pulls down the gates of inverter transistors 34 and 36 to 0V, and as a result transistor 34 pulls up the gate of n-channel transistor 14 to the voltage at node Inv 30, turning it on. This negative feedback holds output node 24 at 0V.

Since the wordline WL 28 is coupled to the select transistors of all memory cells in a row, FIG. 2C provides for an Erase Inhibit and Program Inhibit mode for each memory cell in that row to individually deselect each cell from being erased or programmed, respectively. In all of the "Erase Inhibit", "Erase", "Program Inhibit", and "Program" modes, WL2 is at −0.5V, and the Inv node 38 is at 0V (causing n-channel transistor 14 to be turned off). Also, as will be appreciated by persons of ordinary skill in the art, the switch transistor is prevented from turning on, either by placing its source and drain terminals at the same potential, or by disconnecting one of the power supply nodes to the circuitry controlled by the switch transistor. This prevents unpredictable circuit states appearing during the configuration process from either damaging the circuitry or clamping the power supply.

To inhibit erasing of a memory cell in "Erase Inhibit" mode, node 18 is placed at 1.8V, the wordline WL 28 is placed at 1.8V, and the bitline BL 30 is placed at 1.8V. Under these conditions, there is no voltage drop across ReRAM 12 and it cannot change state.

To erase the memory cell, in "Erase" mode node 18 is placed at 1.8V, the wordline WL 28 is placed at 1.8V, the bitline BL 30 is placed at 0V. Under these conditions, select transistor 32 is turned on, placing 0V at output node 24. Since node 18 is at 1.8V and output node 24 is at 0V, there is a potential of 1.8V across ReRAM device 12 having a polarity to cause ReRAM device 12 to be erased. The potential of −0.5V on the gate of p-channel transistor 16 drives its gate at least one Vt below the voltage (0V) at the source/drain terminal connected to the output node 24, fully turning on p-channel transistor 16. The allows the full voltage (1.8V) to appear across the ReRAM cell 12 as it begins to turn off.

To inhibit programming of a memory cell in "Program Inhibit" mode, node 18 is placed at 0V, the wordline WL 28 is placed at 2.5V, the bitline BL 30 is placed at 0V. Under these conditions, there is no voltage drop across ReRAM device 12 and thus programming is inhibited. To program the memory cell, i.e., change it to its low impedance state, node 18 is placed at 0V, the wordline WL 28 is placed at 2.5V, the bitline BL 30 is placed at 1.8V. Under these conditions, select transistor 32 is turned on, placing 1.8V at output node 24. Since node 18 is at 0V and output node 24 is at 1.8V, there is a potential of 1.8V across ReRAM device 12 with a polarity to cause ReRAM device 12 to program. The potential of −0.5V on the gate of p-channel transistor 16 drives its gate at least one Vt below the voltage (0V) at the source/drain terminal connected to the ReRAM device 12, thus turning it fully on. The allows 1.8V to appear across the ReRAM cell thus programming it to the low impedance state.

Persons of ordinary skill in the art will appreciate that the potential of 1.8V used in the operating mode examples above is a nominal value and the voltage value used in any actual embodiment of the present invention will depend on factors including the device geometries, process parameters, and material thicknesses, and will be determined at the design stage of the integrated circuit.

Referring now to FIG. 3A, is a schematic diagram which shows an illustrative configuration memory cell 70 in accordance with an aspect of the present invention. Certain ones of the elements of configuration memory cell 70 are present in configuration memory cell 10 and radiation tolerant memory cell 50 of FIG. 1 and FIG. 2A and the same reference numerals used in those drawing figures will be used in FIG. 3A to identify like elements.

Configuration memory cell 70 is a push-pull memory cell and employs a ReRAM device 12 as a pullup device. Configuration memory cell 70 employs two series connected n-channel transistors 14a and 14b as pulldown devices. ReRAM device 12 is connected in series with a pair of series connected p-channel transistors 16a and 16b and n-channel transistors 14a and 14b between a first voltage potential 18 and a second voltage potential 20 (shown as ground). The gates of the p-channel transistors 16a and 16b are connected together to a global word line (WL2) 22. The common drain connections of the p-channel transistor 16b and the n-channel transistor 14a forms an output node 24 for the memory cell 70. The output node 24 drives the gate of a switch transistor 26 controlled by the memory cell 70.

Each configuration memory cell 70 is located at an intersection between a row word line (WL) 28 and a column bit line (BL) 30. An n-channel select transistor 32 is connected between the bit line BL 30 and the common node forming the drain of p-channel transistor 16a and the source of p-channel transistor 16b in the memory cell 70. The gate of the n-channel select transistor 32 is connected to the word line WL 28.

An inverter 42 formed from p-channel inverter transistor 34 and n-channel inverter transistor 36 is connected between the output node 24 of the memory cell 70 and the gates of the n-channel transistors 14a, 14b. The source of the p-channel inverter transistor 34 is connected to a node INV 38 and the drain of the p-channel inverter transistor 34 is connected to the drain of n-channel inverter transistor 36 and to the gate of each of n-channel transistor 14a and n-channel transistor 14b, and the source of the n-channel inverter transistor 36 is connected to a voltage node 40. Voltage node 40 is typically connected to ground.

The configuration memory cell 70 utilizes two n-channel transistors 14a and 14b in series and two p-channel transistors 16a and 16b in series. The reason for providing two n-channel and two p-channel transistors is to allow the circuit to be operated at voltages higher than could be tolerated by a single p-channel or single n-channel transistor alone. This becomes more important in deep sub-micron technologies such as FinFET. Like the configuration memory cell 10 in FIG. 1, the configuration memory cell 70 of FIG. 3A does not include the high-resistance well connection from the ReRAM device and is therefore is not radiation tolerant.

FIG. 3B shows the bias potentials to be applied to the configuration memory cell 70 of FIG. 3A during all of its operating modes, including inhibiting and enabling erasing and programming the memory cells. The potentials shown in FIG. 3B are applied in the same manner as those discussed with reference to FIG. 2B. The program and erase voltage/current path in the cell 70 of FIG. 3A includes node 18, ReRAM 12, and p-channel transistor 16a. In this sense, it is exactly the same as the program and erase voltage/current path in the cells 10 and 50 of FIG. 1 and FIG. 2B including node 18, ReRAM 12, and p-channel transistor 16, the only difference being that one of the potentials is applied to the common node of the two p-channel transistors instead of to the output node 24. During operate mode the two p-channel transistors 16a and 16b share the voltage drop so that lower voltage transistors can be used, thus avoiding having to employ a larger sized single p-channel transistor 16. The size savings are substantial, since the next larger sized transistor has a channel length of about 90 nm as opposed to approximately 20 nm for each of transistors 16a and 16b.

Figures 4A, 4B:
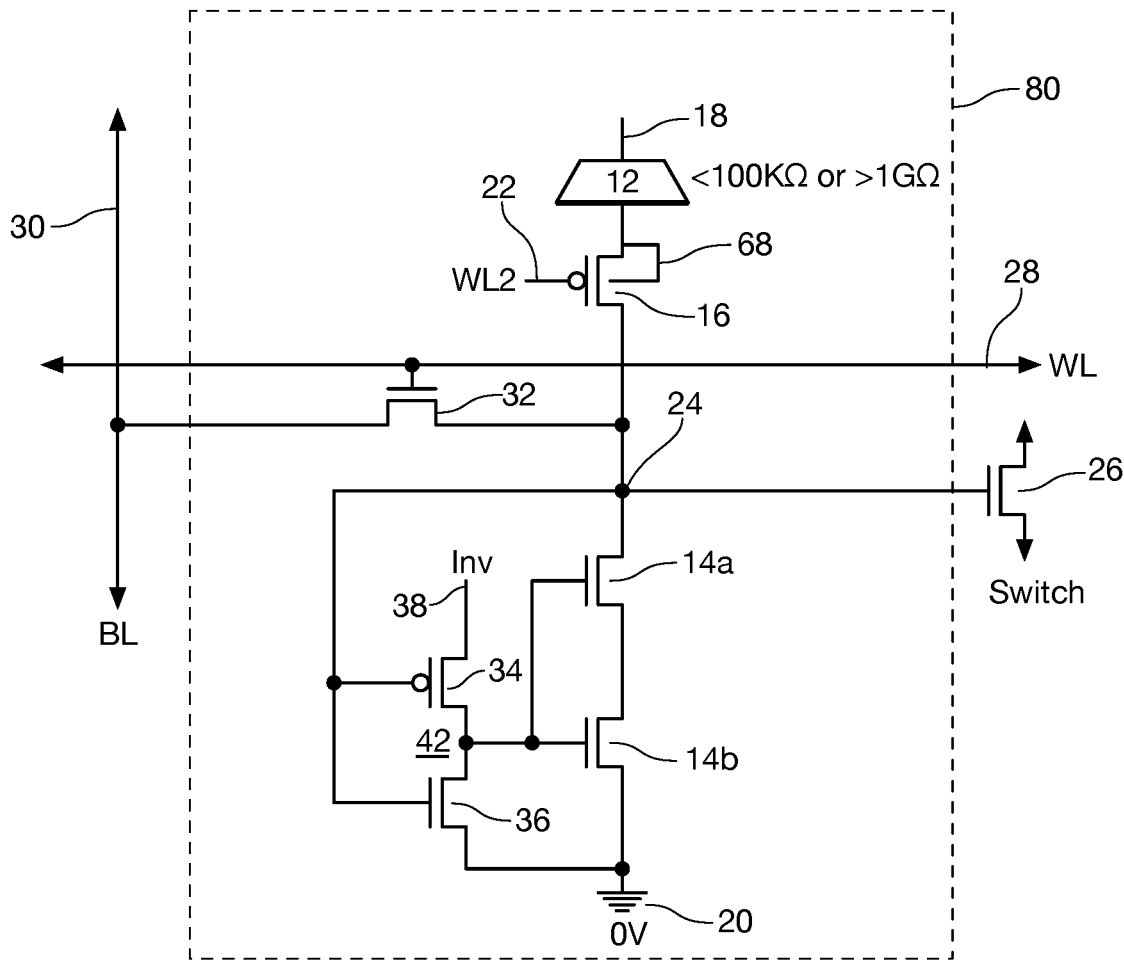
FIG. 4A is a schematic diagram a schematic diagram of an illustrative configuration memory cell in accordance with an aspect of the present invention.
FIG. 4B is a table showing the potentials applied to the various nodes of the configuration memory cell of FIG. 4A during different operating modes.

Referring now to FIG. 4A, is a schematic diagram shows an illustrative configuration memory cell 80 in accordance with an aspect of the present invention. Configuration memory cell 80 is radiation tolerant in that it includes the high-impedance connection 68 to the well containing p-channel transistor 16 and further differs from memory cell 70 of FIG. 3A in that only a single p-channel transistor 16 is used. The reason for providing two n-channel transistors and only one p-channel transistor is that during operate mode the stress across p-channel transistor 16 is less than the stress on the series connection of n-channel transistors 14a and 14b because the ReRAM device 12 is sharing with p-channel transistor 16 the voltage drop between output node 24 and node 18. In programming or erase mode, no more than 0.9V appears across any one transistor.

FIG. 4B is a table that shows the bias potentials to be applied to the configuration memory cell 80 of FIG. 4A during all of its operating modes, including inhibiting and enabling erasing and programming the memory cells. The potentials shown in FIG. 4B are applied in the same manner as those discussed with reference to FIG. 2C.

Referring now to FIGS. 5A and 5B, schematic diagrams show an illustrative configuration memory cell 90 with redundant ReRAM devices in accordance with an aspect of the present invention and a circuit for selecting between the redundant ReRAM devices. Certain ones of the elements of configuration memory cell 90 are present in the configuration memory cells 10, 50, and 70 and the same reference numerals used in previous drawing figures will be used in FIG. 5A to identify like elements.

Configuration memory cell 90 is radiation tolerant but is otherwise similar to the configuration cell 70 of FIG. 3A and is redundant in that it includes a first ReRAM device 12a in series with p-channel transistors 16a and 16b between voltage potential 18 and the output node 24 and a second ReRAM device 12b in series with p-channel transistors 16c and 16d between voltage potential 18 and the output node 24. The gates of p-channel transistors 16a and 16b are connected to global word line WL2 22a and the gates of p-channel transistors 16c and 16d are connected to global word line WL3 22b. Global word lines WL2 and WL3 22a and 22b are used to select which one of ReRAM devices 12a and 12b will be connected in the configuration cell 90. A voltage of 1.5V at either of these global word lines will turn off the two p-channel transistors to disconnect the ReRAM device from the circuit and a voltage of about 1.1V will turn on the two p-channel transistors to connect the ReRAM device to the circuit.

As in the other radiation tolerant embodiments of the invention disclosed herein, high-impedance well connections are provided to the n-well in which the p-channel transistors are formed. In most layouts of a ReRAM cell having two series connected p-channel transistors connected in series with the ReRAM cell (e.g., in FIG. 5A p-channel transistors 16a and 16B connected to ReRAM device 12a and p-channel transistors 16c and 16d connected to ReRAM device 12b), the two p-channel transistors will be formed in a single n-well. The high-impedance well connection 68a is connected to the n-well (not shown) containing p-channel transistors 16a, and 16b and the high-impedance well connection 68b is connected to the n-well (not shown) containing p-channel transistors 16c and 16d. The single high-impedance well connection to each n-well protects both p-channel transistors formed in that well in the manner described with reference to FIG. 2B.

Circuit 92 shown in FIG. 6 is an exemplary selection circuit that can be used to drive global word lines WL2 and WL3 to select which one of ReRAM devices 12*a* and 12*b* will be connected to the configuration memory circuit of FIG. 5A.

Multiplexer 94 has its data output connected to global word line WL2 22*a*. A first data input of multiplexer 94 is connected to a common connection between ReRAM devices 96*a* and 96*b*. If ReRAM device 96*a* is programmed (turned on, i.e. set to low resistance) and ReRAM device 96*b* is turned off (erased, i.e. set to high resistance), 1.5V will appear at their common connection at the first data input of multiplexer 94. If ReRAM device 96*a* is erased (turned off) and ReRAM device 96*b* is turned on (programmed), 1.1V will appear at their common connection at the first data input of multiplexer 94.

A second data input of multiplexer 94 is connected to line 98 that is used to supply potentials necessary for programming and erasing ReRAM device 12*a*. The select input 100 for multiplexer 94 selects between normal operating conditions (supplying either 1.5V or 1.1V responsive to programming/erasing of ReRAM devices 96*a*/96*b*) through the multiplexer 94 to the global word line WL2 22*a*, and program/erase conditions (supplying programming or erase potentials) to the global word line WL2 22*a*.

Multiplexer 102 has its data output connected to global word line WL3 22*b*. A first data input of multiplexer 102 is connected to a common connection between ReRAM devices 104*a* and 104*b*. If ReRAM device 104*a* is turned on (programmed) and ReRAM device 104*b* is turned off (erased), 1.5V will appear at their common connection at the first data input of multiplexer 102. If ReRAM device 104*a* is erased (turned off) and ReRAM device 104*b* is turned on (programmed), 1.1V will appear at their common connection at the first data input of multiplexer 102.

A second data input of multiplexer 102 is connected to line 106 that is used to supply potentials necessary for programming and erasing ReRAM 12*b*. The select input 100 for multiplexer 94 is also connected to the select input of multiplexer 102 and selects between normal operating conditions (supplying either 1.5V or 1.1V responsive to programming/erasing of ReRAM devices 104*a*/104*b*) through the multiplexer 102 to the word line WL3 22*b*, and program/erase conditions (supplying programming or erase potentials) to the word line WL3 22*b*.

FIG. 5B is a table that shows the bias potentials to be applied to the configuration memory cell 90 of FIG. 5A during all of its operating modes, including inhibiting and enabling erasing and programming the memory cells. The potentials shown in FIG. 5B are applied in the same manner as those discussed with reference to FIG. 2B. Configuration memory cell 90 advantageously provides for redundancy for ReRAM devices 12*a*, 12*b*, without the need for providing two complete cells. The cost for redundancy is the redundant ReRAM device itself with the addition of the 2 series PFET transistors, and any selection circuitry required.

Figure 7A:
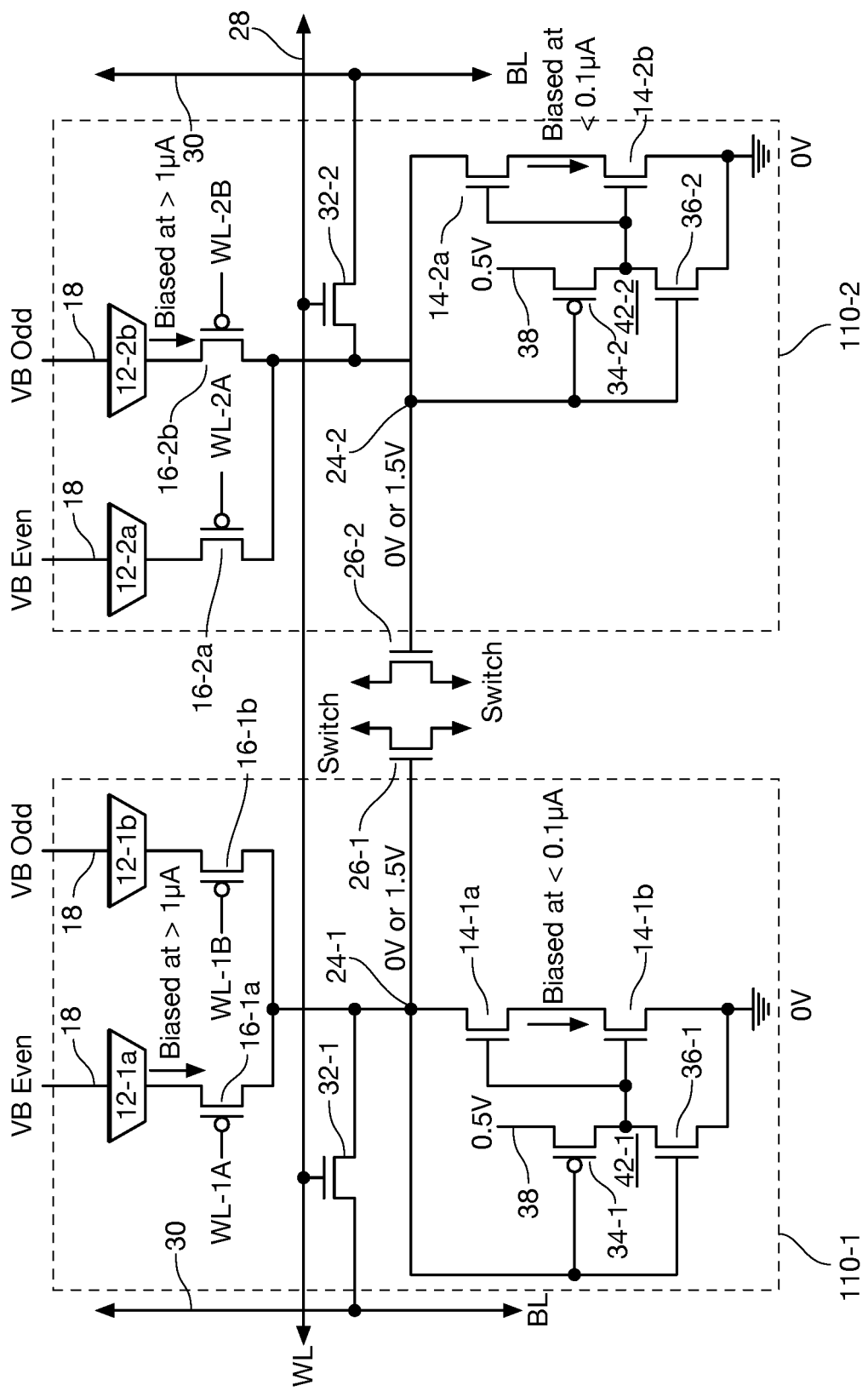
FIG. 7A is a schematic diagram of another illustrative redundant configuration memory cell in accordance with one aspect of the present invention.

Referring now to FIG. 7A, a schematic diagram shows a pair of another illustrative redundant configuration memory cells (shown within dashed lines 110-1 and 110-2) in accordance with one aspect of the present invention. Redundant configuration memory cells 110-1 and 110-2 are identical to one another.

Certain ones of the elements of configuration memory cells 110-1 and 110-2 are present in the configuration memory cells depicted in the other drawing figures and the same reference numerals used in those drawing figures will be used in FIG. 7A to identify like elements. The reference numerals identifying elements of the configuration memory cells 110-1 and 110-2 will be followed by respective suffixes "-1" and "-2", respectively.

Configuration memory cells 110-1 and 110-2 operate in substantially the same manner as configuration memory cell 80 of FIG. 4A. The redundancy in configuration memory cell 110-1 is implemented by activating one of wordlines WL-1A and WL-1B while de-activating the other. Similarly, the redundancy in configuration memory cell 110-2 is implemented by activating one of wordlines WL-2A and WL-2B while de-activating the other. Configuration memory cell 110 advantageously provides for redundancy for ReRAM devices 12-1*a*, 12-1*b*, without the need for providing two complete cells. The cost for redundancy is the redundant ReRAM device itself with the addition of the series p-channel transistors, and any selection circuitry required.

Persons of ordinary skill in the art will appreciate that the redundant configuration memory cells depicted in FIG. 5A and FIG. 7A have the advantage that, instead of implementing a redundant memory, they may be used to store two bits of information whose output is controllable using the redundancy controls.

Referring now to FIGS. 7B and 7C, are tables that show the bias potentials to be applied to the configuration memory cells 110*a* and 110*b* during all of its operating modes, including inhibiting and enabling erasing and programming the memory cells.

Persons of ordinary skill in the art will note that the voltages at nodes VB Even (VBE) and VB Odd (VBO) in the tables of FIGS. 7B and 7C differ. FIG. 7B shows the bias potentials applied to nodes VBE and VBO when ReRAM device 12-1*a* is active and FIG. 7C shows the bias potentials applied to nodes VBE and VBO when ReRAM device 12-1*b* is active. Such skilled persons will also recognize that the bias potentials shown in FIGS. 7B and 7C differ from the bias potentials shown in FIG. 2C and the other operation potential tables in that the polarities of the potentials applied across the ReRAM devices are reversed in the program and erase modes to account for the opposite orientation of the ReRAM devices shown in FIG. 7A (as shown by the thicker lines representing the ion source sides of the ReRAM devices 12-1*a*, 12-1*b*, 12-2*a*, and 12-2*b* being on the upper ends of the devices as opposed to being on the lower end of ReRAM devices 12 in FIGS. 1 and 2A).

Persons of ordinary skill in the art will appreciate that the ReRAM structure is polarity dependent and for many circuit applications the bias for the off state is static. In these circuit applications it is thus desirable to orient the polarity of the static bias in the direction that reinforces the off state. In many integrated circuit layouts this will result in significant area increase in layout area. One such case is when the ReRAM device is manufactured between the first and second metal layers (metal one and metal two) in an integrated circuit with the ion source being part of, or connected to, the metal two layer which is ultimately to be connected to a transistor via a metal one level connection, and the metal one layer of the ReRAM device has to be connected to a programming bias line on the metal two layer. In this situation, it would be desirable to be able to connect the ReRAM device in the reverse direction (i.e., upside down) to eliminate all the extra wiring. This can be done if the reverse bias applied to the off-state ReRAM is low enough so as not to disturb the device, for example less than 0.5 Volts. In such an upside-down configuration, the programming and erase potentials are easily reversed. Thus it is possible to use the ReRAM device in the reverse orientation depicted in FIG. 7A in any of the other embodiments disclosed herein.

Some of the embodiments disclosed herein have been shown including the high-impedance well connection 68 while others have not. This is done simply to demonstrate that the radiation tolerance feature of the present invention is an optional feature of the invention that may be used at the discretion of the circuit designer.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A nonvolatile memory cell comprising:
   a first voltage supply node;
   a second voltage supply node;
   an output node;
   a first resistive random access memory device having a first electrode and a second electrode, the first electrode connected to the first voltage supply node;
   at least one first p-channel transistor connected between the second electrode of the first resistive random access memory device and the output node;
   at least one n-channel transistor connected between the output node and the second voltage supply node; and
   an inverter connected between the output node and a gate of the at least one n-channel transistor.

2. The nonvolatile memory cell of claim 1 wherein:
   the at least one first p-channel transistor is formed in an n-well; and
   the second electrode of the first resistive random access memory device is connected to the n-well.

3. The nonvolatile memory cell of claim 1 wherein:
   the inverter includes a p-channel inverter transistor in series with an n-channel inverter transistor, the p-channel inverter transistor having a source coupled to a first inverter voltage potential and the n-channel inverter transistor having a source coupled to a second inverter voltage potential, the p-channel inverter transistor and the n-channel inverter transistor having gates connected together to the output node, and the p-channel inverter transistor and the n-channel inverter transistor having drains connected together to a gate of the n-channel transistor.

4. The nonvolatile memory cell of claim 1 wherein the at least one n-channel transistor comprises two series connected n-channel transistors having their gates connected together.

5. The nonvolatile memory cell of claim 1 wherein the at least one first p-channel transistor comprises two series connected first p-channel transistors having their gates connected together.

6. The nonvolatile memory cell of claim 1 further comprising:
   a bit line associated with the memory cell;
   a word line associated with the memory cell; and
   a select transistor coupled between the bit line and the output node, the select transistor having a gate connected to the word line.

7. The nonvolatile memory cell of claim 5 further comprising:
   a bit line associated with the memory cell;
   a word line associated with the memory cell; and
   a select transistor coupled between the bit line and a common source drain terminal of the two series connected first p-channel transistors, the select transistor having a gate connected to the word line.

8. The nonvolatile memory cell of claim 1 wherein the at least one first p-channel transistor has a gate connected to a bias word line.

9. The nonvolatile memory cell of claim 1 wherein the first electrode of the first resistive random access memory device is coupled to an ion source and the second electrode of the random access memory device is coupled to a solid electrolyte material.

10. The nonvolatile memory cell of claim 1 wherein the first electrode of the first resistive random access memory device is coupled to a solid electrolyte material and the second electrode of the random access memory device is coupled to an ion source.

11. The nonvolatile memory cell of claim 1, further comprising:
    a third voltage supply node;
    a first bias node connected to a gate of the at least one first p-channel transistor;
    a second resistive random access memory device having a first electrode and a second electrode, the first electrode connected to the third voltage supply node;
    at least one second p-channel transistor connected between the second electrode of the second resistive random access memory device and the output node, the second p-channel transistor having a gate connected to a second bias node; and
    a selection circuit coupled to the first bias node and the second bias node, the selection circuit operable to couple one of the first and second resistive random access memory devices to the output node.

12. The nonvolatile memory cell of claim 11 wherein:
    the at least one first p-channel transistor is formed in a first n-well;
    the second electrode of the resistive random access memory device is connected to the first n-well;
    the at least one second p-channel transistor is formed in a second n-well; and
    the second electrode of the resistive random access memory device is connected to the second n-well.

13. The nonvolatile memory cell of claim 11 wherein:
    the inverter includes a p-channel inverter transistor in series with an n-channel inverter transistor, the p-channel inverter transistor having a source coupled to a first inverter voltage potential and the n-channel inverter transistor having a source coupled to a second inverter voltage potential, the p-channel inverter transistor and the n-channel inverter transistor having gates connected together to the output node, and the p-channel inverter transistor and the n-channel inverter transistor having drains connected together to a gate of the n-channel transistor.

14. The nonvolatile memory cell of claim 11 wherein the at least one n-channel transistor comprises two series connected n-channel transistors having their gates connected together.

15. The nonvolatile memory cell of claim 11 wherein:
    the at least one first p-channel transistor comprises two series connected first p-channel transistors having their gates connected together; and
    the at least one second p-channel transistor comprises two series connected second p-channel transistors having their gates connected together.

16. The nonvolatile memory cell of claim 11 further comprising:
   a bit line associated with the memory cell;
   a word line associated with the memory cell; and
      a select transistor coupled between the bit line and the output node, the select transistor having a gate connected to the word line.

17. The nonvolatile memory cell of claim 15 further comprising:
   a bit line associated with the memory cell;
   a word line associated with the memory cell; and
      a select transistor coupled between the bit line and a common source drain terminal of the two series connected first p-channel transistors, the select transistor having a gate connected to the word line.

18. In a ReRAM configuration memory cell having a ReRAM device connected in series with at least one p-channel transistor formed in an n-well and connected between a voltage supply potential and an output node, a method for protecting the memory cell from a state change caused by a particle strike comprising:
   biasing the n-well at the voltage supply potential through the ReRAM device.

* * * * *